United States Patent [19]
Singh et al.

[11] Patent Number: 6,042,687
[45] Date of Patent: Mar. 28, 2000

[54] METHOD AND APPARATUS FOR IMPROVING ETCH AND DEPOSITION UNIFORMITY IN PLASMA SEMICONDUCTOR PROCESSING

[75] Inventors: Vikram Singh; Brian McMillin; Tom Ni, all of Fremont; Michael Barnes, San Francisco; Richard Yang, Fremont, all of Calif.

[73] Assignee: Lam Research Corporation, Fremont, Calif.

[21] Appl. No.: 08/885,346

[22] Filed: Jun. 30, 1997

[51] Int. Cl.$^7$ .............................. H05H 1/00; H01L 21/00
[52] U.S. Cl. ..................... 156/345; 118/723 I; 216/68; 427/569
[58] Field of Search .................. 156/345; 118/723 I, 118/723 IR, 715, 723 E; 216/68; 427/569; 204/298.07, 298.33

[56] References Cited

U.S. PATENT DOCUMENTS 4,173,661  11/1979  Bourdon .
4,270,999   6/1981  Hassan et al. .

(List continued on next page.)

FOREIGN PATENT DOCUMENTS 0520519  12/1992  European Pat. Off. .
0637058   2/1995  European Pat. Off. .
0674336   9/1995  European Pat. Off. .
0676790  10/1995  European Pat. Off. .
0709875   5/1996  European Pat. Off. .

OTHER PUBLICATIONS

"An Evaluation of Fluorine Doped Peteos on Gap Fill Ability and Film Characterization", by K. Hewes et al., Texas Instruments, Dallas, Texas, DUMIC Conference Feb. 21–22, 1995.

"Fundamentals, Etching Deposition, and Surface Interaction", by Stephen M. Rossnagel et al., *Handbook of Plasma Processing Technology*, (1989), pp. 233, 248–251, 285–306.

"Electron cyclotron resonance microwave discharges for etching and thin–film deposition", by Jes,–Asmussen, *J. Vac. Sci. Technol. A.*, vol. 7, No. 3, (May/Jun. 1989), pp. 883–893.

"Silicon Dioxide Films Produced by PECVD of TEOS and TMCTS", by D. Webb et al., *10439 Proceedings of the Int. Symp. on Ultra Large Scale Integration Science and Technology*, (1989), No. 9, Pennington, NJ, pp. 571–585.

"Low–temperature deposition of silicon dioxide films from electron cyclotron resonant microwave plasmas", by T.V. Herak et al., *J. Appl. Phys.*, 65(6), (Mar. 15, 1989), pp. 2457–2463.

"Reaction etching technology in thin–transistor processing", by Y. Kuo, *IBM J. Res. Develop.*, vol. 36, No. 1, (Jan. 1992), pp. 69–75.

"Preparation of SiOF Films with Low Dielectric Constant by ECR Plasma Chemical Vapor Deposition", by T. Fukada et al., *Extended Abstracts of the 1995 International Conference on Solid State Devices and Materials*, (1993), pp. 158–160.

(List continued on next page.)

*Primary Examiner*—Thi Dang
*Attorney, Agent, or Firm*—Burns, Doane, Swecker & Mathis, L.L.P.

[57] ABSTRACT

A plasma processing system and method for processing substrates such as by chemical vapor deposition or etching. The system includes a plasma processing chamber, a substrate support for supporting a substrate within the processing chamber, a dielectric member having an interior surface facing the substrate support, the dielectric member forming a wall of the processing chamber, a primary gas supply supplying a primary gas such as process gas into the chamber, a secondary gas supply supplying a secondary gas such as a substantially inert, a substrate passivating or a reactant scavenging gas into the chamber, and an RF energy source such as a planar coil which inductively couples RF energy through the dielectric member and into the chamber to energize the primary gas into a plasma state. The secondary gas is concentrated near the periphery of the substrate, improving etching/deposition uniformity across the substrate surface.

29 Claims, 3 Drawing Sheets

U.S. PATENT DOCUMENTS

| | | |
|---|---|---|
| 4,512,283 | 4/1985 | Bonifield et al. . |
| 4,579,618 | 4/1986 | Celestino et al. . |
| 4,614,639 | 9/1986 | Hegedus . |
| 4,691,662 | 9/1987 | Roppel et al. . |
| 4,806,321 | 2/1989 | Nishizawa et al. . |
| 4,854,263 | 8/1989 | Chang et al. . |
| 4,877,641 | 10/1989 | Dory . |
| 4,913,929 | 4/1990 | Moslehi et al. . |
| 4,919,745 | 4/1990 | Fukuta et al. . |
| 4,943,345 | 7/1990 | Asmussen et al. . |
| 4,948,458 | 8/1990 | Ogle . |
| 4,980,204 | 12/1990 | Fujii et al. . |
| 4,992,301 | 2/1991 | Shishiguchi et al. . |
| 4,996,077 | 2/1991 | Moslehi et al. . |
| 5,105,761 | 4/1992 | Charlet et al. . |
| 5,134,965 | 8/1992 | Tokuda et al. . |
| 5,164,040 | 11/1992 | Eres et al. . |
| 5,169,509 | 12/1992 | Latz et al. . |
| 5,192,370 | 3/1993 | Oda et al. . |
| 5,231,334 | 7/1993 | Paranjpe . |
| 5,252,133 | 10/1993 | Miyazaki et al. . |
| 5,262,029 | 11/1993 | Erskine et al. . |
| 5,267,607 | 12/1993 | Wada . |
| 5,279,865 | 1/1994 | Chebi et al. . |
| 5,280,154 | 1/1994 | Cuomo et al. . |
| 5,346,578 | 9/1994 | Benzing et al. . |
| 5,368,710 | 11/1994 | Chen et al. . |
| 5,384,008 | 1/1995 | Sinha et al. . |
| 5,387,289 | 2/1995 | Schmitz et al. ............... 156/345 X |
| 5,399,387 | 3/1995 | Law et al. . |
| 5,401,350 | 3/1995 | Patrick et al. . |
| 5,405,480 | 4/1995 | Benzing et al. . |
| 5,415,728 | 5/1995 | Hasegawa et al. . |
| 5,423,945 | 6/1995 | Marks et al. ...................... 438/695 |
| 5,498,313 | 3/1996 | Bailey et al. . |
| 5,522,934 | 6/1996 | Suzuki et al. . |
| 5,522,936 | 6/1996 | Tamura . |
| 5,525,159 | 6/1996 | Hama et al. . |
| 5,529,657 | 6/1996 | Ishii . |
| 5,531,834 | 7/1996 | Ishizuka et al. . |
| 5,552,124 | 9/1996 | Su . |
| 5,556,521 | 9/1996 | Ghanbari . |
| 5,614,055 | 3/1997 | Fairbairn et al. . |
| 5,620,523 | 4/1997 | Maeda et al. ............... 118/723 I X |
| 5,653,806 | 8/1997 | Van Buskirk . |
| 5,707,692 | 1/1998 | Suzuki ............................ 118/723 I |
| 5,772,771 | 6/1998 | Li et al. ......................... 118/723 I |
| 5,803,975 | 9/1998 | Suzuki ........................... 156/345 X |
| 5,851,294 | 12/1998 | Young et al. .................... 156/345 X |
| 5,851,600 | 12/1998 | Horiike et al. .............. 118/723 I X |

OTHER PUBLICATIONS

"New approach to low temperature deposition of high–quality thin films by electron cyclotron resonance microwave plasmas", by T.T. Chau et al., *J. Vac. Sci. Technol. B.*, vol. 10(5) (Sep./Oct. 1992), pp. 2170–2178.

"Silicon dioxide trench filling process in a radio–frequency hollow cathode reactor", by M. Gross et al., *J. Vac. Sci. Technol. B.*, vol. 11(2), (Mar./Apr. 1993), pp. 242–248.

"Biased Electron Cyclotron Resonance Chemical–Vapor Deposition of Silicon Dioxide Inter–Metal Dielectric Thin Films", by P. Shufflebotham et al., *Materials Science Forum*, Switzerland, vol. 140–142, (1993) pp. 255–268.

"Preparation of SiOF Films with Low Dielectric Constant by ECR Plasma Chemical Vapor Deposition", by T. Fukada et al., *Extended Abst. of the 1993 Intern. Conf. on Solid State Devices and Materials*, (Feb. 21–22, 1995), pp. 43–49.

"High Density Plasma Deposition and Deep Submicron Gap Fill with Low Dielectric Constant SiOF Films", by L.Q. Qian et al., *DUMIC Conference*, (Feb. 21–22, 1995), 1995 ISMIC—101D/95/0050, pp. 50–56.

"Dual Frequency Plasma CVD Fluorosilicate Glass Water Absorption and Stability", by M.J. Shapiro et al.*DUMIC Conference*, (Feb. 21–22, 1995), 1994 ISMIC–101D/95/118, pp. 118–123.

"Comparison of PECVD F–TEOS Films and High Density Plasma SiOF Films", by D.C. Schuchmann et al., *VMIC Conference*, (Jun. 27–29, 1995), 1995 ISMIC–104/95/0097, pp. 97–103.

"Water–absorption mechanisms of F–doped PECVD $SiO_2$ with low–dielectric constant", by H. Miyajima et al., *VMIC Conference*, (Jun. 27–29, 1995), 1995 ISMIC–104/95/0391, pp. 391–393.

"Controlling Fluorine Concentration and Thermal Annealing Effect on Liquid–Phase Deposited $SiO_{2-x}F_x$ Films", by C.F. Yeh, *J. of Electrochem. Soc.*, vol. 142, No. 10, (Oct. 1995), pp. 3579–3583.

METHOD AND APPARATUS FOR IMPROVING ETCH AND DEPOSITION UNIFORMITY IN PLASMA SEMICONDUCTOR PROCESSING

CROSS-REFERENCE TO RELATED APPLICATION

The present application is related to U.S. patent application Ser. No. 08/672,315, filed on Jun. 28, 1996, herein incorporated by reference.

FIELD OF THE INVENTION

The present invention relates to a method and system for maximizing processing uniformity in a plasma processing system. More particularly, the present invention relates to a system and a method for distributing a primary process gas and a secondary gas in a plasma processing chamber to maximize processing uniformity.

BACKGROUND OF THE INVENTION

Vacuum processing chambers are generally used for chemical vapor depositing (CVD) of materials on substrates by supplying process gas to the vacuum chamber and applying a radio frequency (RF) field to the gas. A number of gas distribution systems for integrated circuit processing are known, but the vast majority of known systems are designed for low-density, high pressure plasma etching or for plasma enhanced CVD (PECVD). Conventional gas distribution systems typically deliver reactants at relatively low flow rates. Showerhead gas injection and diffusive transport systems are commonly used to ensure even distribution over the substrate.

Various systems have been proposed to inject process gas above the substrate to maximize deposition and etch rate and to minimize film deposits on various internal surfaces of the reactor. FIG. 1a illustrates a conventional plasma processing system in which gas inlets supply gas into a plasma processing chamber. As shown in FIG. 1a, this system includes a plasma source 110 for generating a plasma in a processing chamber 140 and a gas ring 167 with attached gas inlets supplying process gas into the processing chamber 140 for processing a substrate 120 on a substrate support 130. This type of system may also include an additional gas ring 160 for delivering process gas.

Other gas injection systems have been proposed to provide a more uniform distribution of process gas across a substrate surface. For example, U.S. Pat. No. 4,996,077 to Moslehi et al. discloses an electron cyclotron resonance (ECR) device including gas injectors arranged around the periphery of a substrate to provide a uniform distribution of non-plasma gases. U.S. Pat. No. 5,614,055 to Fairbairn et al. discloses a showerhead injection system in which injector orifices, located on the ceiling of the reactor, inject a reactant gas in such a manner that the reactant gas is uniformly distributed.

While these proposed gas injection systems offer improved uniformity of gas distribution above the substrate, this does not necessarily result in uniform etching or deposition. A problem with injecting gas to provide uniform gas distribution is that it is difficult to control an increase in the etch rate near the edge of the substrate and the edge of the substrate is typically etched at a faster rate than the rest of the substrate. This is referred to as "edge fast etching." This behavior adversely affects the uniformity of aluminum etching, for example, which typically has been limited to about 15% (3 σ).

It has been proposed that the aluminum etch non-uniformity in $Cl_2/BCl_3$ plasma is caused by a radial gradient in etchant concentration. This is due to the rapid reaction rate causing the etching to shift to the mass-transport limited regime. A "bulls-eye" pattern is observed in chemical driven etch systems due to more efficient replenishment of reactive species at the edges of the substrate compared to the center. This is illustrated in FIG. 1b which shows a sectional view of a typical processing chamber 140 and a computer simulated etch by-product concentration 125 above a substrate 120. The concentration of by-products is lowest near the feed gas inlet and increases towards the substrate. In FIG. 1b, the etch by-product concentration 125 is uniform across the substrate 120 except at the edge of the substrate, where it is lower due to diffusion. This leads to an edge fast etch.

To improve etching uniformity, systems have been proposed which use focus rings to "balance" gas flow above the substrate. For example, U.S. Pat. No. 5,552,124 to Y. J. Su discloses a plasma processing device including a slotted focus ring. Such focus rings are sometimes referred to as diffusion barriers, because they inhibit diffusive transport/exchange of gaseous reactants and byproducts near the substrate perimeter. That is, the diffusion barrier inhibits higher gas flow/higher plasma density at the substrate edge to avoid non-uniform processing of the substrate.

One problem with systems employing focus rings is that polymers generated from gaseous etch by-products or reactants are sometimes deposited on the focus rings. During subsequent substrate processing, this deposited polymer can cause undesirable contamination of the substrate being processed.

Other proposed systems have made use of various etchable sacrificial rings (composed of, for example, silicon or aluminum) positioned around the perimeter of the substrate to deplete the reactant gas concentration near the substrate edge. The use of sacrificial rings around the substrate is problematic because it is sometimes difficult to remove native oxides naturally formed on these surfaces, since the ion bombardment on these rings is typically less than the ion bombardment on the substrate. In addition, polymer deposition may also occur on these sacrificial rings due to the lower ion bombardment. These polymer deposits and native oxides can lead to process shift (i.e., failure to meet tolerances during sequential processing of individual substrates), which makes the sacrificial rings generally ineffective in improving the substrate etch uniformity.

Other gas supplying arrangements for plasma processing reactors are disclosed in U.S. Pat. Nos. 4,614,639; 4,996,077; 5,134,965; 5,415,728; and 5,498,313. Such reactors include low density plasma parallel plate etching reactors and high density plasma electron cyclotron resonance (ECR) microwave reactors for chemical vapor deposition (CVD) and etching. The parallel plate reactors are limited in their ability to process fine structure of semiconductor devices due to damage caused by energy of ions colliding with the substrate due to increases in applied energy and particle problems due to ion collisions with reactor walls. The ECR reactors are limited in their ability to scale to larger substrate sizes such as flat panel displays.

There is thus a need for a scalable plasma processing system which provides uniform plasma processing (e.g., etching and deposition) across the surface of a substrate but without presenting the contamination problems inherent in focus/sacrificial ring systems, or in parallel plate reactor systems.

SUMMARY OF THE INVENTION

It is an object of the present invention to provide a gas distribution system which provides uniform etching and deposition across the surface of a substrate.

According to the present invention, this and other objects are met by a scalable plasma processing system and method for processing a substrate. The plasma processing system includes a plasma processing chamber, a substrate support for supporting a substrate within the processing chamber, a dielectric member having an interior surface facing the substrate support, the dielectric member forming a wall of the processing chamber, a primary gas supply for supplying a primary gas such as process gas (e.g., one or more reactant gases and possibly one or more inert gases) into the chamber and towards the substrate, a secondary gas supply which delivers a secondary gas such as a substantially inert, a substrate passivating, and/or reactant scavenging gas (e.g., one or more inert gases and/or one or more reactive gases) in a manner which largely concentrates the secondary gas around the immediate periphery of the substrate, and an RF energy source which inductively couples RF energy through the dielectric member and into the chamber to energize the process gas into a plasma state. The substantially inert, passivating and/or scavenging gas is concentrated near the periphery of the substrate improving etching/deposition uniformity across the substrate surface.

According to exemplary embodiments of the present invention, the primary gas supply can comprise a showerhead, a gas ring, or discrete injector tubes to deliver the process gas. The secondary gas supply can comprise a gas ring attached to a wall of the processing chamber, above the substrate, or a gas ring around the periphery of the substrate support. The secondary gas supply can, alternately, comprise conduits arranged around the periphery of the substrate as part of or separate from the substrate support.

DETAILED DESCRIPTION OF THE PREFERRED EMBODIMENTS

The present invention is designed to inject a substantially inert, a substrate passivating, and/or a reactant scavenging gas, so as to be concentrated near the periphery of a substrate achieve uniform etching or deposition on the substrate.

Figure 1A:
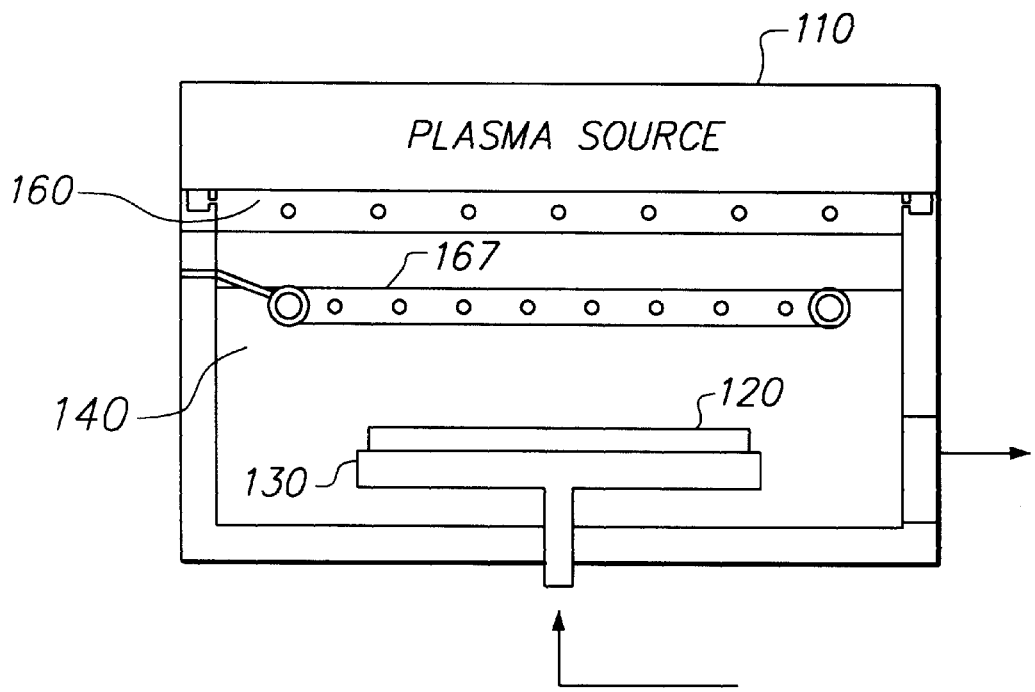
FIG. 1a illustrates a conventional plasma processing system.
Figure 1B:
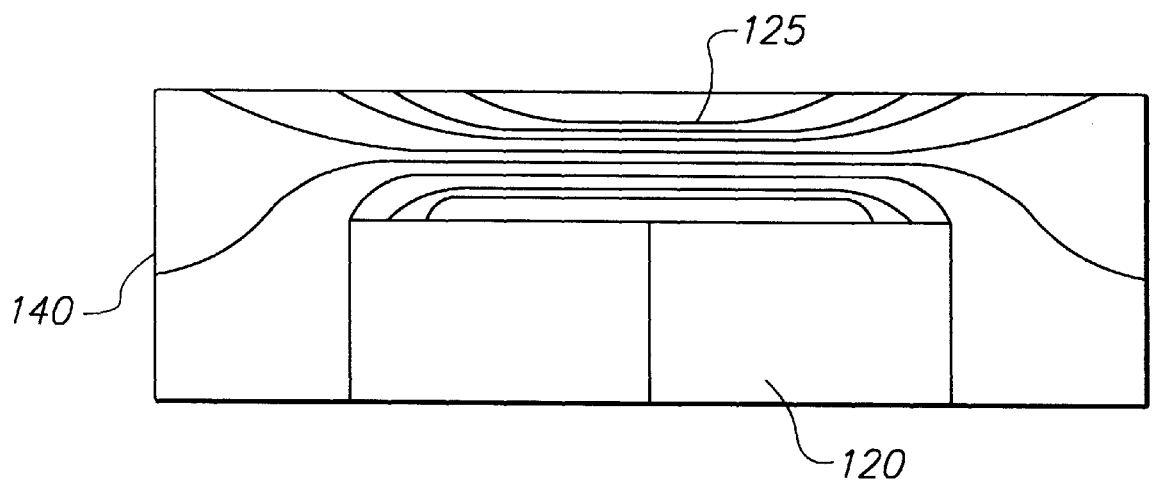
FIG. 1b illustrates a problem of non-uniform by-product concentration in conventional plasma processing systems.
Figure 2:
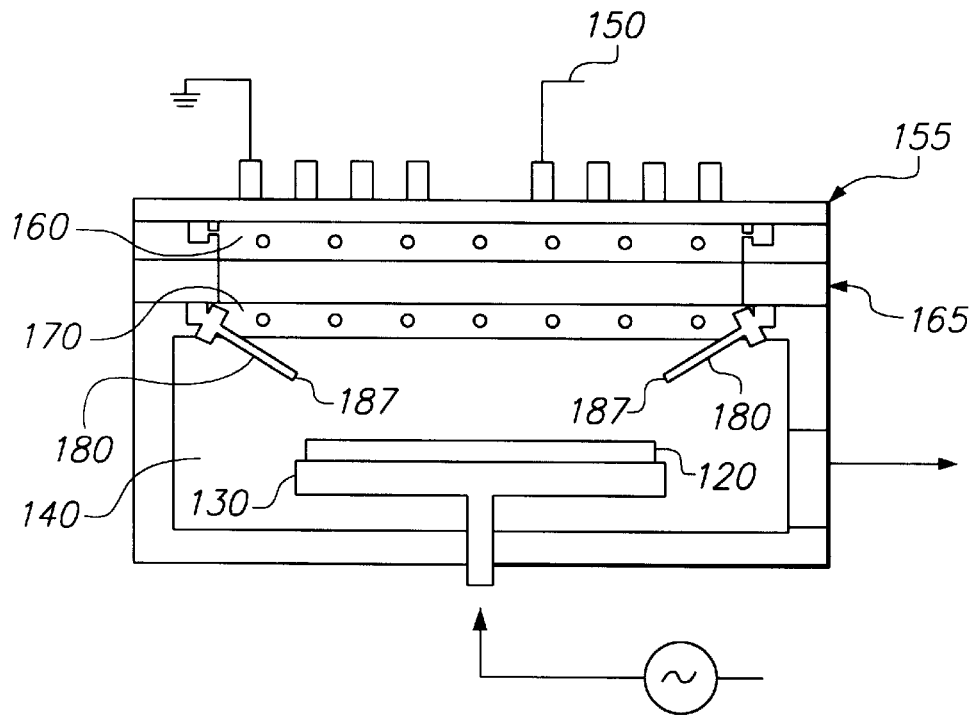
FIG. 2 illustrates an exemplary plasma processing system according to a first embodiment of the present invention.

FIG. 2 illustrates an exemplary plasma processing system according to a first embodiment of the present invention. As shown in FIG. 2, a plasma processing system for processing a substrate 120 comprises a substrate support assembly 130 and a processing chamber 140 enclosing the substrate support. The substrate 120 may be, for example, a semiconductor substrate having diameters such as 4", 6", 8", 12", etc., a glass substrate for making a flat panel display, and so on. The substrate support 130 may comprise, for example, an RF powered electrode. The substrate support 130 may be supported from a lower endwall of the chamber 140 or may be cantilevered, e.g., extending from a sidewall of the chamber 140. The substrate 120 may be clamped to the electrode 130 either mechanically or electrostatically.

A substrate to be processed is inserted into the processing chamber 140. The substrate is processed in the processing chamber by energizing a process gas in the processing chamber into a high density plasma. A scalable source of energy maintains a high density (e.g., $10^{11}$–$10^{12}$ ions/cm$^3$) plasma in the chamber. For example, an antenna 150, such as the planar multiturn spiral coil shown in FIG. 2, a non-planar multiturn coil, or an antenna having another shape, powered by a suitable RF source and suitable RF impedance matching circuitry, inductively couples RF energy into the chamber to generate a high density plasma. However, the plasma can be generated by other sources such as ECR, parallel plate, helicon, helical resonator, etc., type sources. The processing chamber 140 may, for example, be a vacuum chamber including a suitable vacuum pumping apparatus attached to one or more outlets in a wall of the chamber for maintaining the interior of the chamber at a desired pressure (e.g., below 5 Torr, preferably 1–100 mTorr). A dielectric window, such as the planar dielectric window 155 of uniform thickness shown in FIG. 2 or a non-planar dielectric window, a showerhead or gas distribution plate, etc., is provided between the antenna 150 and the interior of the processing chamber 140 and forms the vacuum wall at the top of the processing chamber 140.

The process gas can be supplied through a primary gas supply such as a conventional gas ring 160 as shown in FIG. 2. The gas ring 160 is located just below the dielectric window 155. In the case of metal etching such as aluminum, the process gas can include, for example, a mixture of $Cl_2$ and $BCl_3$. The process gas is delivered through orifices in the gas ring 160. Any suitable gas ring may be used as the gas ring 160. Alternatively, gas ring 160 may be replaced or supplemented with any suitable gas injection system, such as a showerhead or gas distribution plate.

A secondary gas supply comprising, for example, a gas ring 170 supplies a secondary gas into the chamber 140. The secondary gas can comprise, for example, one or more inert gases, such as argon or helium, a substrate passivating gas such as nitrogen, oxygen, $BCl_3$, fluorocarbons, or hydrofluorocarbons, or reactant-scavenging gases such as hydrogen or ammonia.

The gas ring 170 may be located below the gas ring 160, separated therefrom by an optional spacer 165 formed of aluminum or anodized aluminum, as shown in FIG. 2. Alternately, although not shown, the gas ring 160 may be located below the gas ring 170, between the gas ring 170 and the substrate 120.

The gas ring 170 may be mechanically attached to the chamber housing above the substrate. The gas ring 170 may be made of, for example, aluminum or anodized aluminum. Alternatively, the secondary gas can be supplied through a showerhead or nozzle arrangement.

The secondary gas supply can further include a plurality of detachable injectors 180 connected to the gas ring 170 to direct at least some of a secondary gas onto the substrate 120. These gases are delivered to the substrate from the injectors 180 through injector exit orifices 187. Additionally, a secondary gas may be delivered through orifices in the gas ring 170. The injectors may be made of any suitable material such as aluminum, anodized aluminum, quartz or ceramics such as $Al_2O_3$, AlN, $Si_3N_4$, etc. Although two injectors are shown in FIG. 2, any number of injectors may be used. For example, an injector may be connected to each of the orifices on the gas ring 170. The injectors 180 are located above the plane of the substrate 120, with their orifices at any suitable distance such as, for example, three to ten centimeters from the substrate.

Preferably, the injectors are spaced near or outside of the substrate periphery, for example zero to five centimeters from the substrate periphery. This helps to ensure that the secondary gas is concentrated at the substrate periphery. The injectors are oriented such that at least some of the injectors direct the secondary gas in a direction which intersects the exposed surface of the substrate at an acute angle. Preferably, the angle or axis of injection can be any suitable angle such as 20 to 60° (e.g., 45°) from the horizontal plane of the substrate.

Figure 3:
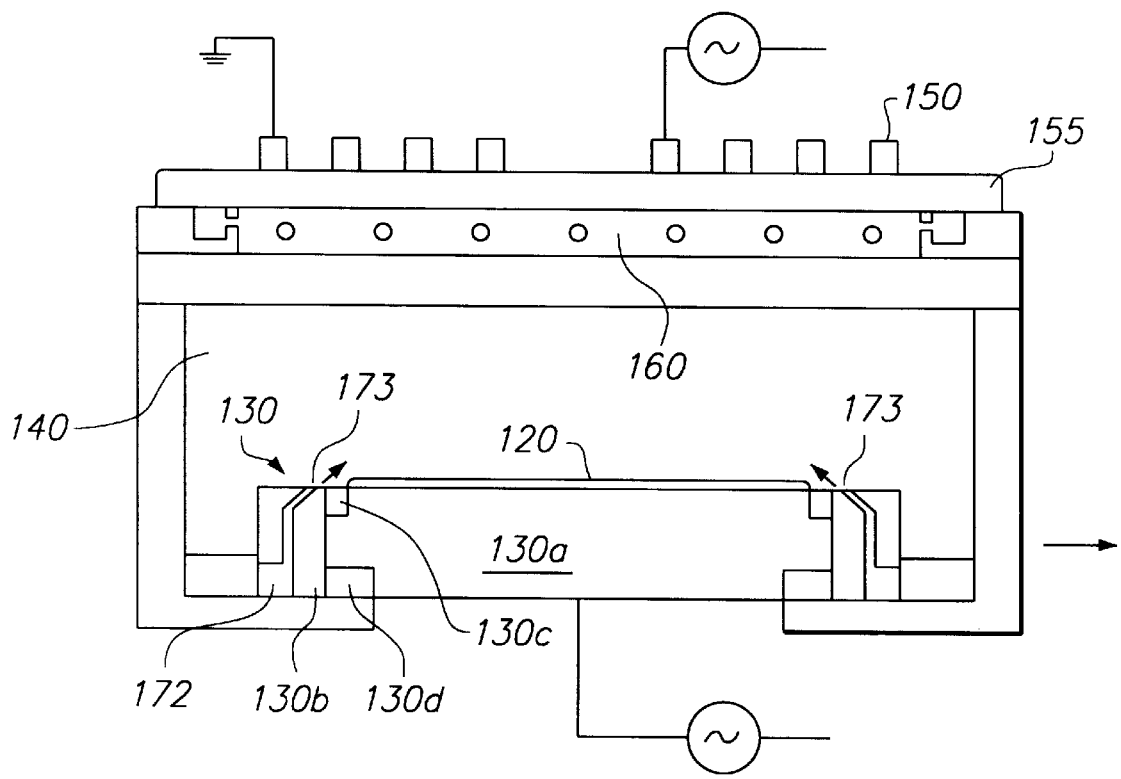
FIG. 3 illustrates an exemplary plasma processing system according to a second and preferred embodiment of the present invention.

According to a second and preferred embodiment of the present invention, the secondary gas may be supplied through injectors 173 connected to a gas ring 172 on the chamber floor. FIG. 3 illustrates an exemplary plasma processing system according to a second embodiment of the present invention. In the system shown in FIG. 3, the primary process gas is delivered via the gas ring 160, and the secondary gas is injected through injectors 173 connected to an annular ring 172 which encloses the substrate support. The injection of a secondary gas (such as a substantially inert gas) around the periphery of the substrate dilutes the reactive gases in the immediate vicinity of the outer periphery of the substrate. In the case of an aluminum etch, which typically exhibits an edge-fast etch profile, this dilution reduces the etch rate near the edge of the substrate and thus leads to an improved etching uniformity. Alternatively, the injection of the surface passivating gas as the secondary gas reduces the etch rate at the edge due to blocking of surface reaction regions. The effective etch rate is a balance between the substrate etch rate and the rate of surface passivation. By concentrating the surface passivating gas near the substrate periphery, the surface passivation is greater near the edge of the wafer which reduces the edge fast etch rate. Alternatively, the injection of a scavenging (secondary) gas reacts with reactants near the edge of the wafer and converts them to inert or at least less reactive gases thereby improving process uniformity.

In FIG. 3, the substrate support assembly 130 includes a substrate support 130a, a gas ring 130b, a dielectric edge ring 130c and a dielectric spacer 130d, the edge ring and spacer maintaining a gap between the gas ring and the substrate support. A plurality of injection orifices 173 connected to secondary gas ring 172 are circumferentially distributed in the gas ring 130b outside the periphery of the substrate. Although two injectors are shown in FIG. 3, according to an exemplary embodiment, the secondary gas ring comprises thirty two equally spaced sonic injectors, 0.020" in diameter, located approximately 1.3" outside the periphery of an 8" substrate. The number of injectors may vary from about 4–64 or more, the orifice diameter may range from 0.010–0.12", and the proximity of the injector to the substrate edge may range from about 0 to 3" or more. The injectors can be oriented to inject the gas at any suitable angle such as 20 to 90° (e.g., 45°) from the horizontal plane of the substrate, as illustrated in FIG. 3.

For typical processing conditions, the secondary gas exits the injection orifices at sonic velocity and subsequently expands. Alternately, the secondary gas can be injected subsonically, or an internally contoured nozzle can be used within each injector to achieve supersonic flow at the exit of the injector orifice.

Figure 4:
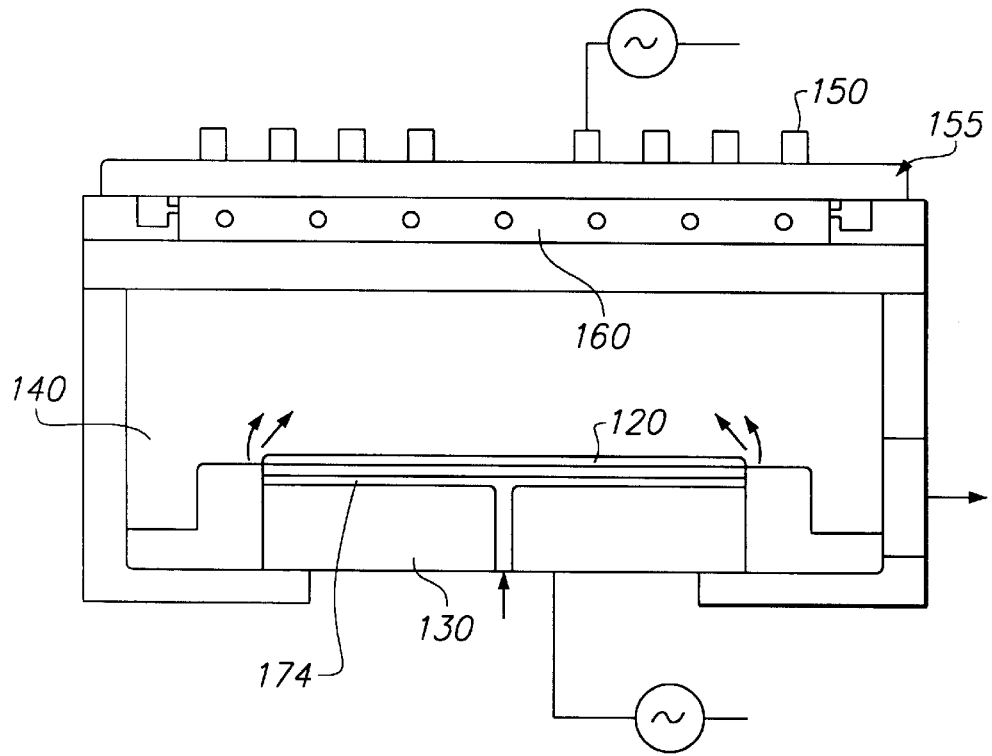
FIG. 4 illustrates an exemplary plasma processing system according to a third embodiment of the present invention.

FIG. 4 illustrates an exemplary plasma processing system according to a third embodiment of the present invention. As shown in FIG. 4, a secondary gas is injected from the substrate support 130 in order to concentrate the secondary gas near the substrate periphery. Preferably, for maximum control and flexibility, this secondary gas injection is independent of and in addition to the minimal gas leakage emanating from the substrate periphery as a result of helium backside cooling of the substrate (not shown). The usual backside helium leakage is normally minimal, typically 0.1–1 sccm per Torr of backside helium pressure. For example, the backside helium leakage is on the order of a few sccms at 8 Torr backside pressure for a 200 mm substrate, a flow which is not adequate to achieve the uniformity improvement desired according to the present invention. Furthermore, the helium leakage is intimately tied to the helium backside pressure, which limits the flexibility of this source of substantially inert non-reactive gas. Hence, another source for gas injection which is independent of backside helium provides the most process flexibility. In a case where the secondary gas is substantially inert, the secondary gas injection may provide the added benefit of reducing polymer deposition on the edge ring 130c surrounding the substrate support 130a.

Figure 5:
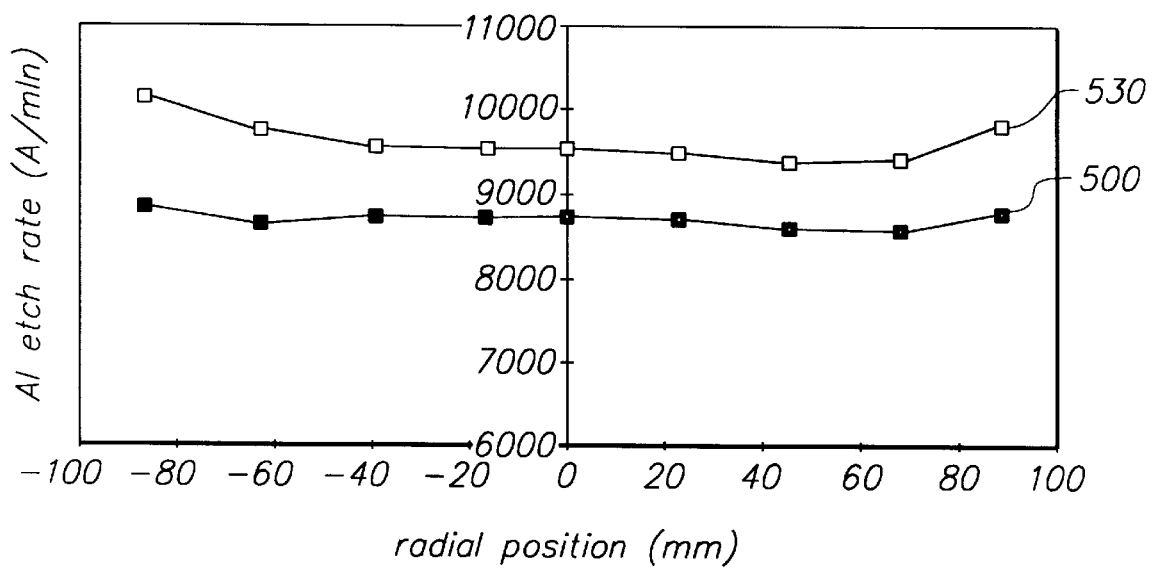
FIG. 5 illustrates an exemplary graph showing the etch rate across the surface of a substrate with and without the injection of a substantially inert gas.

FIG. 5 shows exemplary aluminum etch rate profiles obtained for two 200 mm patterned aluminum substrates both with and without secondary gas injection near the substrate periphery. In FIG. 5, line 500 represents the case with injection of a substantially inert gas at an angle of 45° from the horizontal plane of the substrate and line 530 represents the case without secondary gas injection.

As can be seen from FIG. 5, etching is more uniform with the addition of a secondary gas which in this example was comprised of a substantially inert gas (argon). These substrates were etched using a commercially available Lam Research Corp. TCP9400™ etch tool which was modified to provide the capability for inert gas injection at the substrate periphery, and center process gas feed through the TCP™ showerhead window (8 holes on a 0.75" circle, each 0.04" diameter, not shown). The baseline process parameters were 150 sccm $Cl_2$ flow, 10 mTorr chamber pressure, 600 Watts of TCP™ (antenna) power, 200 Watts bias power (substrate holder), 6 Torr He backside pressure, and 60° C. chamber and electrode temperatures.

For the case with inert secondary gas injection, 50 sccm of argon was injected through a gas ring 172 as illustrated above in FIG. 3. For the case without argon injection the Al etch rate was approximately 9660 Å/min with a 3.4% (1 σ) uniformity. With argon injection, the etch rate was approximately 8760 Å/min with a 2.0% (1 σ) uniformity. For this non-optimized case, the uniformity improves by almost a factor of two with only a 10% decrease in etch rate. By locating the secondary gas injection orifices closer to the substrate edge, one would expect that less argon flow would be necessary to achieve the desired improvement in uniformity, with an even smaller reduction in the overall etch rate. According to the present invention, the method of injecting a secondary gas can be easily tailored to different process conditions simply by changing the amount or composition of secondary gas injected or by changing the process pressure. The invention provides advantages over other approaches which use mechanical structures or surfaces (that cannot be adjusted in situ) for improving etch uniformity. In addition, secondary gas injection does not suffer from particle contamination or process drift/repeatability problems around the substrate periphery.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma processing system comprising:
   a plasma processing chamber;
   a substrate support supporting a substrate within the processing chamber;
   a dielectric member having an interior surface facing the substrate support, wherein the dielectric member forms a wall of the processing chamber;
   a primary gas supply supplying a primary gas into the chamber;
   a secondary gas supply supplying a secondary gas into the chamber in a zone adjacent the periphery of the substrate, the secondary gas supply injecting the secondary gas at an acute angle with respect to a plane parallel to the exposed surface of the substrate; and
   a radio frequency energy source which inductively couples radio frequency energy through the dielectric member and into the chamber to energize the primary gas into a high density plasma state to process the substrate.

2. The system of claim 1, wherein the plasma processing chamber is a chemical vapor deposition plasma reactor or a plasma etching reactor.

3. The system of claim 1, wherein the secondary gas supply supplies a substantially inert gas.

4. The system of claim 1, wherein the secondary gas supply comprises elongated injector tubes.

5. The system of claim 4, wherein gas outlets of a plurality of the injector tubes are distributed around the substrate periphery.

6. The system of claim 4, wherein the injector tubes inject the secondary gas at an acute angle with respect to a plane parallel to an exposed surface of the substrate.

7. The system of claim 1, wherein an open space extends between the substrate periphery and a sidewall of the chamber.

8. The system of claim 1, wherein the secondary gas supply injects the secondary gas at subsonic or sonic velocity and the primary gas supply injects the primary gas at a subsonic, sonic or supersonic velocity.

9. The system of claim 1, wherein the radio frequency source comprises a planar or nonplanar antenna.

10. The system of claim 1, wherein the substrate support includes an electrostatic chuck and at least one electrode supplying an RF bias to the substrate.

11. The system of claim 1, wherein the primary gas supply comprises a gas ring, a showerhead, a gas distribution plate, or discrete injector tubes through which process gas is supplied into a space between the substrate and the dielectric member.

12. The system of claim 1, wherein the secondary gas supply supplies a substrate passivating gas comprising nitrogen, oxygen, borontrichloride, fluorocarbons, hydrofluorocarbons or mixture thereof.

13. The system of claim 1, wherein the secondary gas supply supplies a hydrogen-containing gas.

14. The system of claim 1, wherein the secondary gas supply supplies a reactant-scavenging gas comprising hydrogen, ammonia or mixture thereof.

15. The system of claim 1, wherein the secondary gas supply comprises outlets in part of the substrate support.

16. The system of claim 1, wherein the secondary gas supply comprises outlets in a gas ring surrounding a substrate support, the outlets injecting the secondary gas at an acute angle with respect to a plane parallel to the exposed surface of the substrate.

17. A method of depositing or etching a layer on an exposed surface of a substrate comprising:
   placing the substrate on a substrate support in a processing chamber, wherein an interior surface of a dielectric member forming a wall of the process chamber faces the substrate support;
   supplying a primary gas into the processing chamber from a primary gas supply;
   supplying a secondary gas into the processing chamber from a secondary gas supply, the secondary gas being concentrated around the periphery of the substrate, the secondary gas supply injecting the secondary gas at an acute angle with respect to a plane parallel to the exposed surface of the substrate;
   energizing the primary gas into a high density plasma state by inductively coupling radio frequency energy produced by a radio frequency energy source through the dielectric member into the processing chamber, the primary gas being plasma phase reacted with the exposed surface of the substrate such that a layer of material is deposited or etched on the exposed surface.

18. The method of claim 17, the primary gas comprising a process gas supplied from a gas ring, a showerhead, a gas distribution plate, or discrete injectors and the radio frequency energy source comprises a planar or nonplanar antenna.

19. The method of claim 17, wherein the secondary gas is injected from injector tubes located around the substrate periphery.

20. The method of claim 19, wherein the injector tubes inject the secondary gas in a direction which intersects the exposed surface of the substrate.

21. The method of claim 19, wherein the injector tubes inject the secondary gas in a direction which does not intersect the exposed surface of the substrate.

22. The method of claim 17, wherein the secondary gas comprises argon, helium, nitrogen or mixture thereof.

23. The method of claim 17, wherein the secondary gas supply comprises outlets in part of the substrate support, the outlets injecting the secondary gas at an acute angle with respect to a plane parallel to the exposed surface of the substrate.

24. The method of claim 17, wherein individual semiconductor wafers are sequentially processed in the processing chamber.

25. The method of claim 17, wherein the secondary gas supply comprises injector tubes extending from a wall of the chamber opposite to the interior surface of the dielectric member, the injector tubes injecting the secondary gas into an open space between the substrate and the interior surface of the dielectric member.

26. The method of claim 17, wherein the secondary gas is injected at sonic or subsonic velocity and the primary gas is injected at subsonic, sonic or supersonic velocity.

27. The method of claim 17, wherein the secondary gas consists essentially of one or more substantially inert gases.

28. The method of claim 17, wherein the secondary gas comprises a surface passivating gas comprising nitrogen, oxygen, borontrichloride, fluorocarbons, hydrofluorocarbons or mixture thereof.

29. The method of claim 17, wherein the secondary gas comprises a reactant-scavenging gas comprising hydrogen, ammonia or mixture thereof.

* * * * *